(12) United States Patent
Chen et al.

(10) Patent No.: US 6,697,260 B1
(45) Date of Patent: Feb. 24, 2004

(54) HIGH-SPEED PACKAGE DESIGN WITH SUSPENDED SUBSTRATES AND PCB

(75) Inventors: Yu Ju Chen, San Ramon, CA (US); Thomas J. Sleboda, Milpitas, CA (US); Michael Zhong Xuan Wong, Milpitas, CA (US); Hui Wu, Milpitas, CA (US)

(73) Assignee: Big Bear Networks, Inc., Milpitas, CA (US)

( * ) Notice: Subject to any disclaimer, the term of this patent is extended or adjusted under 35 U.S.C. 154(b) by 154 days.

(21) Appl. No.: 10/040,421

(22) Filed: Oct. 29, 2001

(51) Int. Cl.[7] .............................. H05K 5/00; H05K 5/04; H05K 5/06
(52) U.S. Cl. .................. 361/752; 361/753; 361/736; 361/735; 361/785; 361/803; 361/796
(58) Field of Search .................. 361/735, 749, 361/736, 760, 796, 785, 752, 753, 803; 174/35 D

(56) References Cited

U.S. PATENT DOCUMENTS 5,777,850 A * 7/1998 Jakob et al. ................ 361/736
6,452,113 B2 * 9/2002 Dibene et al. .............. 174/260
6,600,658 B2 * 7/2003 Iwata ......................... 361/752

* cited by examiner

Primary Examiner—David Martin
Assistant Examiner—Thanh Yen Tran

(57) ABSTRACT

An integrated high-speed package comprising a package housing having a housing lip and connector having a center pin abutting along a bottom surface of the housing lip. For signal registration of a first substrate to the signal lead, the substrate is "floated" up to the housing lip, which provides an alignment reference to ensure that the top surface of the first substrate is aligned and in direct registration with the signal lead. In another embodiment, the center pin to substrate registration is provided at a top surface of a housing base. The housing base preferably comprises a first portion of a first height and a second portion of a second height. Accordingly, the housing base can accommodate substrates of different thickness while allowing a top surface of the first and a second substrate to be coplanar to facilitate signal registration there between.

21 Claims, 6 Drawing Sheets

"Top down" configuration

HIGH-SPEED PACKAGE DESIGN WITH SUSPENDED SUBSTRATES AND PCB

FIELD OF THE INVENTION

The invention relates to the field of electronic packaging and interconnections.

BACKGROUND OF THE INVENTION

A high-speed electronic module usually consists of interconnected individually packaged components mounted on a PCB board. For very high-speed data or microwave applications, ceramic substrates are usually used for packaging each individual component. Very high-speed communication modules can have a combination of very high-speed interconnects and numerous lower-speed I/O interconnects The combination of high speed connections and a large number of low speed connections make the integrated module design challenging. High speed interconnects between packages or modules require broadband connectors such as Anritsu "V" connectors or HP 2.4 mm, etc. These connectors have strict mechanical registration requirements for the center pin. In other words, the center pin needs to be very accurately aligned in 3 dimensions to transmission lines on the substrate. In addition, these connectors are large, usually much taller than any of the board and substrate dimensions. The low speed interconnections are interconnected through the use of area array techniques such as BGA, LGA, PGA, etc. However, most area array technologies use solder to provide the mechanical and electrical interconnection to the system. Soldered interconnects make it difficult to meet registration requirements of the broadband connector, due to form factor constraints and process engineering challenges, i.e. temperature control, module movement during process, and uneven package weight distribution required during reflow of the solder joints. In addition, CTE mismatch between substrate and PCB material is also of considerable concern, adding yet another constraint to area arrays requiring solder joints.

Traditional microwave packages are routed on the substrate surface. This approach is viable for low I/O counts but is not easily extendable to high pin count devices due to routing limitations.

SUMMARY OF THE INVENTION

The invention comprises a high-speed package design of integrated components, substrates, and a suspended printed circuit board (PCB). This high-speed package integrates high-speed signals with lower speed I/O's, enabling a new generation of high pin count applications while maintaining the signal integrity of the high speed signals. This invention is valid for all substrate materials including plastic and ceramic. It comprises a protective package housing, preferably metal, having a housing lip, and an attached center pin, such as from a connector, which is also attached to the housing and abutting along the housing lip. For an accurate substrate alignment to the center pin, the substrate is mated to the housing lip, which serves as a ceiling and an alignment reference edge to the top surface of the substrate.

Alternatively, if signal registration to a second substrate within the same high-speed package is desired, the housing lip ensures that the top surface of both the first and the second substrate are coplanar and aligned with each other. An accurate, coplanar registration of high speed signal paths is guaranteed, facilitating interconnection between substrates by means such as by wire bonding. Moreover, an accurate alignment of the substrates minimizes the dimensions required of the wire bond for signal registration from one substrate to the other. The high-speed package design of this invention thus meet the strict mechanical requirements for accurate registration and signal integrity from a center pin to the underlying substrate, or alternatively, from the $2^{nd}$ level high-speed interconnects on one substrate to another, for the very high speed I/O's In yet another embodiment, the housing lip serves as a housing base rather than the ceiling of the above described embodiment for the substrate and other underlying layers in the packaging. The principles of the invention remains the same, wherein the housing lip again serves as the alignment reference for the substrate, and thus once the first substrate abuts this alignment reference, the first substrate is in exact registration with a center pin, or easily wire bonded to other signal traces of an another substrate also aligned to the housing lip. In this embodiment, preferably a thin-film substrate with accurate thickness control is used for registration of the center pin to the first substrate. Since thin-film is typically thinner than multilayer substrates, the metal housing is preferably constructed so that the housing has a first height under the thin-film and a second height under the second substrate with the effect of aligning the top surfaces of both substrates, thus minimizing the dimensions of the ribbon-bond.

It is contemplated that variable number of substrates may be assembled with the high-speed package design of this invention. The numerous lower-speed $2^{nd}$ level interconnects routed to the PCB are achieved in the format of various area array technologies. Specifically, an LGA (Land Grid Array) can be used to route numerous lower-speed I/O's up to several gigabits per second. LGA socket provides the $2^{nd}$ level interconnects between the individual component or the substrate and the PCB board. The LGA socket comprises of an interposer and spring-like contacts, which are assembled to the rest of the package through mechanical clamping. In the preferred embodiment, a back plate layer and screws are used to mechanically clamp together all intervening layers between the back plate and the substrate housing, thus eliminating the need for soldering and the attendant engineering challenges. The PCB may either "suspend" beneath the substrate sub-assembly in the "floated" substrate embodiment, or stacked over the substrate sub-assembly, as in the "bottom-up" version. The PCB, relative to the module back plate, is suspended by anchors that screw from the housing to the board. The substrate subassembly can be attached to the PCB via ways of mechanical clamping, epoxying or soldering. Such a package design partitions the regions of very high speed $2^{nd}$ level interconnects and lower speed $2^{nd}$ level interconnects so that all the high speed interconnects that require stringent mechanical tolerances reside within the substrate subassembly and the lower speed $2^{nd}$ level interconnects that do not require stringent mechanical tolerances form the interface between the subassembly and the PCB. It thus accommodates the very different requirements of high speed and lower speed interconnects and ensures the integrity and manufacturability of the final module. It is understood that the various packaging layers described herein are merely illustrative, and varying layers or number of layers underlying the substrate is possible and not intended to limit the ability of this high-speed package design to provide accurate signal to substrate, or substrate-to-substrate registration.

DETAILED DESCRIPTION OF THE PREFERRED EMBODIMENT

Figure 1A:
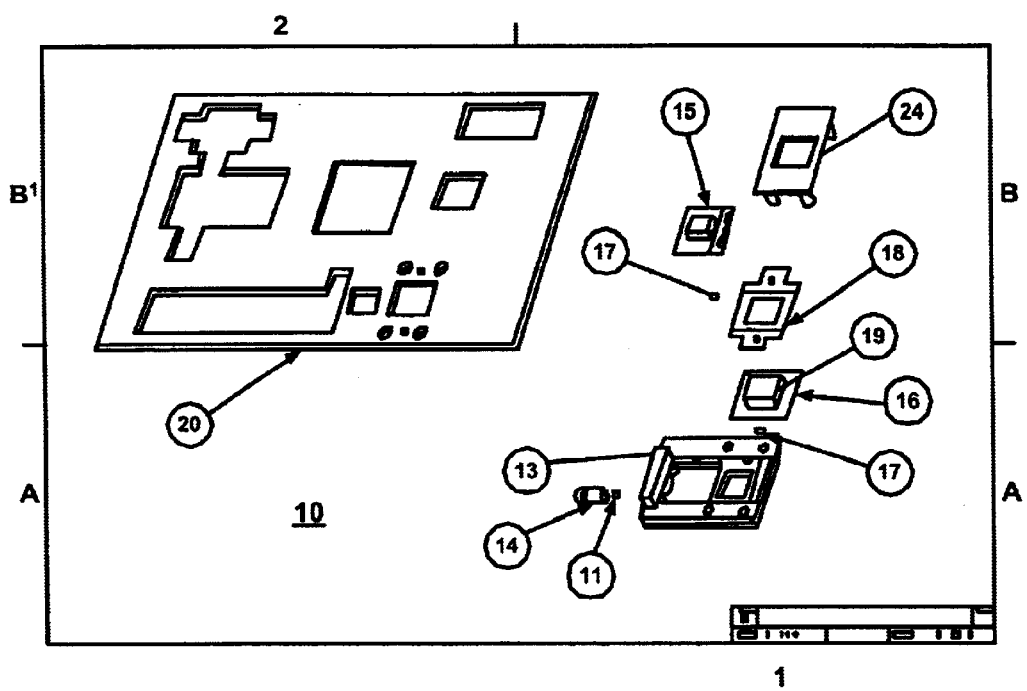
FIG. 1A provides an exploded view of a first embodiment of the high-speed packaging illustrating the components of a "floating" substrate assembly illustrated assembled in FIG. 1B provided in accordance with the principles of this invention.
Figure 1B:
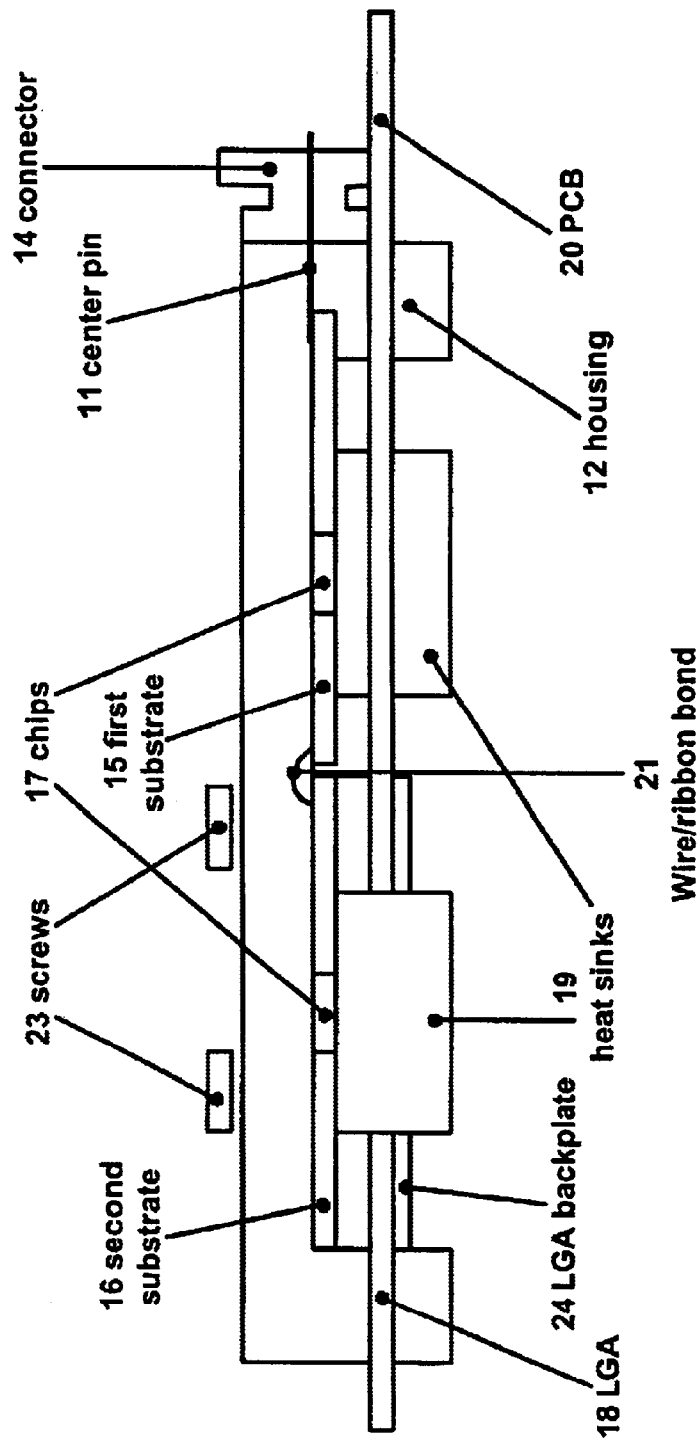
FIG. 1B provides a detailed cross-sectional view of the assembled layers in high-speed packaging assembly of FIG. 1A.
Figure 1C:
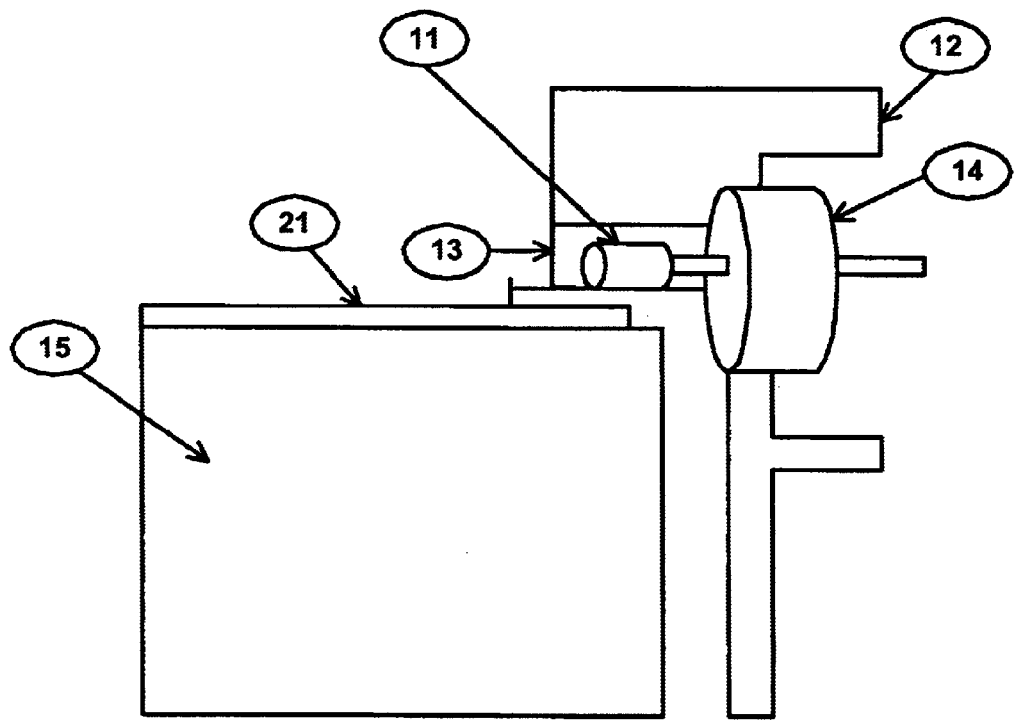
FIG. 1C provides a more detailed cross-sectional view of the substrate to the center pin registration in the high-speed packaging assembly shown in FIGS. 1B.

FIGS. 1A–1C provide a general overview of a first embodiment of high-speed package 10 illustrating the "floating" substrates to PCB assembly in a "top down" configuration in accordance with the principles of this invention. FIG. 1A provides an exploded view of a first embodiment of the high-speed package illustrating the components of a "floating substrate" assembly shown assembled in FIG. 1B. FIG. 1B provides a detailed cross-sectional view of the assembled layers in high-speed packaging assembly of FIG. 1A. In the "floating" substrate configuration, also referred herein as the "top-down" configuration, provided in this embodiment, high-speed package 10 comprises a protective housing 12 with an attached connector 14 comprising a center pin 11 such as from a signal connector. Preferably, housing 12 comprises a housing lip 13 that is hollowed out to accommodate one or more chip substrates, such as first substrate 15 and to provide a "ceiling" and registration reference during signal registration and assembly for a plurality of subsequent assembled layers (see FIGS. 1B–1C) of package 10. Connector 14 comprises a center pin 11 that extends and abuts along a bottom surface of housing lip 13. Thus, as a first contact substrate 15 is "floated" up to and abuts the bottom surface of housing lip 13, a direct electrical connection is induced between electrical traces on a top surface of first substrate 15 and center pin 11.

Additionally, substrate-to-substrate signal registration is also facilitated with housing lip 13, which serves as a coplanar alignment means for the top surfaces of each additional substrate "floated" up to and abutting against the bottom surface of housing lip 13. Thus, the coplanar relation of the top surfaces of first substrate 15 and a second substrate 16 (shown with an integrated plurality of LGA pads) facilitates signal lead alignment and signal registration between substrates 15 and 16. Moreover, such close and coplanar alignment of the two top surfaces minimizes the length of one or more wire or ribbon bonds 21 required to provide the electrical connections between substrate to substrate.

The alignment reference of housing lip 13 also serves to facilitate the assembly process of the plurality of remaining layers in high-speed package 10, such as a land grid array (LGA) 18, a printed circuit board (PCB) layer 20, and an LGA back plate 24, the layers of which are preferably mechanically assembled and bonded together to housing 12 with one or more screws 23. As more easily seen in the exploded view of FIG. 1A and similarly described above with reference to substrate to center pin registration and substrate to substrate registration, housing 12 also provides a reference alignment means of these remaining layers during package assembly via housing lip 13.

FIG. 1B provides a detailed cross-sectional view of the high-speed packaging assembly. FIG. 1B illustrates an example of the resulting sandwiched order of the assembled layers in the "top-down" configuration of this embodiment. For an accurate alignment of a first substrate 15 to center pin 11, first substrate 15 is "floated" up to housing lip 13. Housing lip 13 acts as a ceiling and an alignment edge to ensure that a top surface of substrate 12 abuts the bottom surface of housing lip 13 in direct electrical registration with the electrical lead 11 extending from connector 14 and abutting along a portion of the bottom surface of housing lip 13. FIG. 1C provides a more detailed cross-sectional view of first substrate 15 to center-pin 11 registration. Accordingly, registration of substrate 15 to metal housing lip 13 causes signal traces on substrate 15 to be in electrical contact with center pin 11, thereby generating signal connection between substrate and center pin.

Additionally, as illustrated in FIGS. 1B and 1C, high-speed package 10 enables registration of multiple substrates. Thus, for example, when signal registration is desired between first substrate 15 to a second substrate 16 within the same high-speed package, housing lip 13 ensures that the top surface of the first substrate 15 and the top surface of any other included substrates, such as second substrate 16, are aligned and coplanar with one another when each substrate is "floated" to the reference "ceiling" provided by housing lip 13. Accordingly, housing lip 13 provides an accurate coplanar alignment of the first substrate to another substrate of this assembly. Moreover, an accurate alignment of the substrates minimizes the wire or ribbon bond dimensions required for signal registration from one substrate to the other. The high-speed package design of this invention thus meet the strict mechanical requirements for accurate registration and signal integrity from center pin 11 to the underlying substrate 15, as well as facilitating the signal registration and integrity from one substrate to another in the high-speed package.

Additionally, as shown in FIG. 1B, remaining layers to be assembled in package 10 may be registered and assembled to housing 12 while likewise using housing lip 13 as a registration reference. For example, a land grid array (LGA) 18, a printed circuit board (PCB) 20, and a back plate are similarly "floated" layers registering up to housing lip 13. As illustrated in FIG. 1B, for example, LGA 18 may be floated up to and registers to first and second substrate 15 and 16, which are, in turn, already aligned to housing lip 13. Likewise, PCB 20 is floated up to and under LGA 18. Preferably, an LGA back plate 24 is then registered under PCB 20. The assembled and sandwiched intervening layers, such as substrates 15 and 16, LGA 18, PCB 20, and back plate 24 are then preferably attached together mechanically with one or more screws 23 binding together back plate and the one or more intervening assembled layers to metal housing 13. In the preferred embodiment, the final back plate layer 24 and screws 23 are provided to mechanically clamp together all intervening layers between the back plate and the housing, primarily to eliminate the need for soldering and the attendant engineering challenges associated with the extreme signal sensitivity of high-speed packages. It is also contemplated as within the scope of this invention that a chip 17 such as on substrate 15 or 16 has an attached heat sink 19 for thermal dissipation with a corresponding opening in the remaining assembled layers such as in the LGA and the PCB provided to accommodate such heat sink element.

Figure 2A:
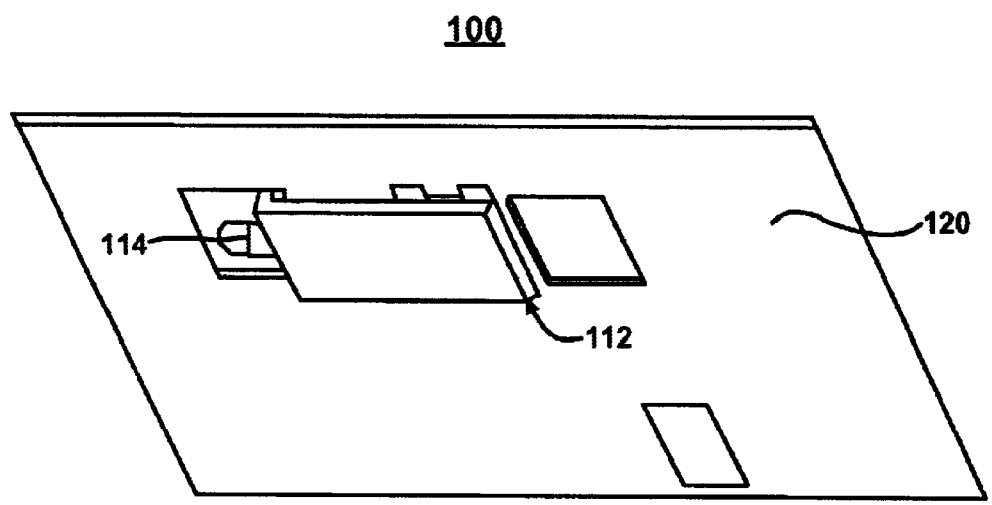
FIG. 2A provides a general overview of another embodiment of the high-speed packaging illustrating the substrates to PCB in a "bottom-up" assembly in accordance with the principles of this invention.
Figure 2B:
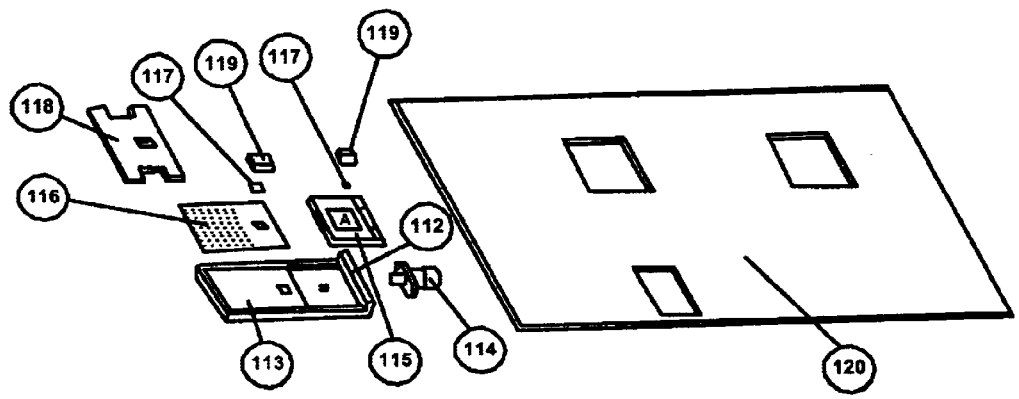
FIG. 2B provides an exploded view of the high-speed packaging assembly of FIG. 2A.
Figure 2C:
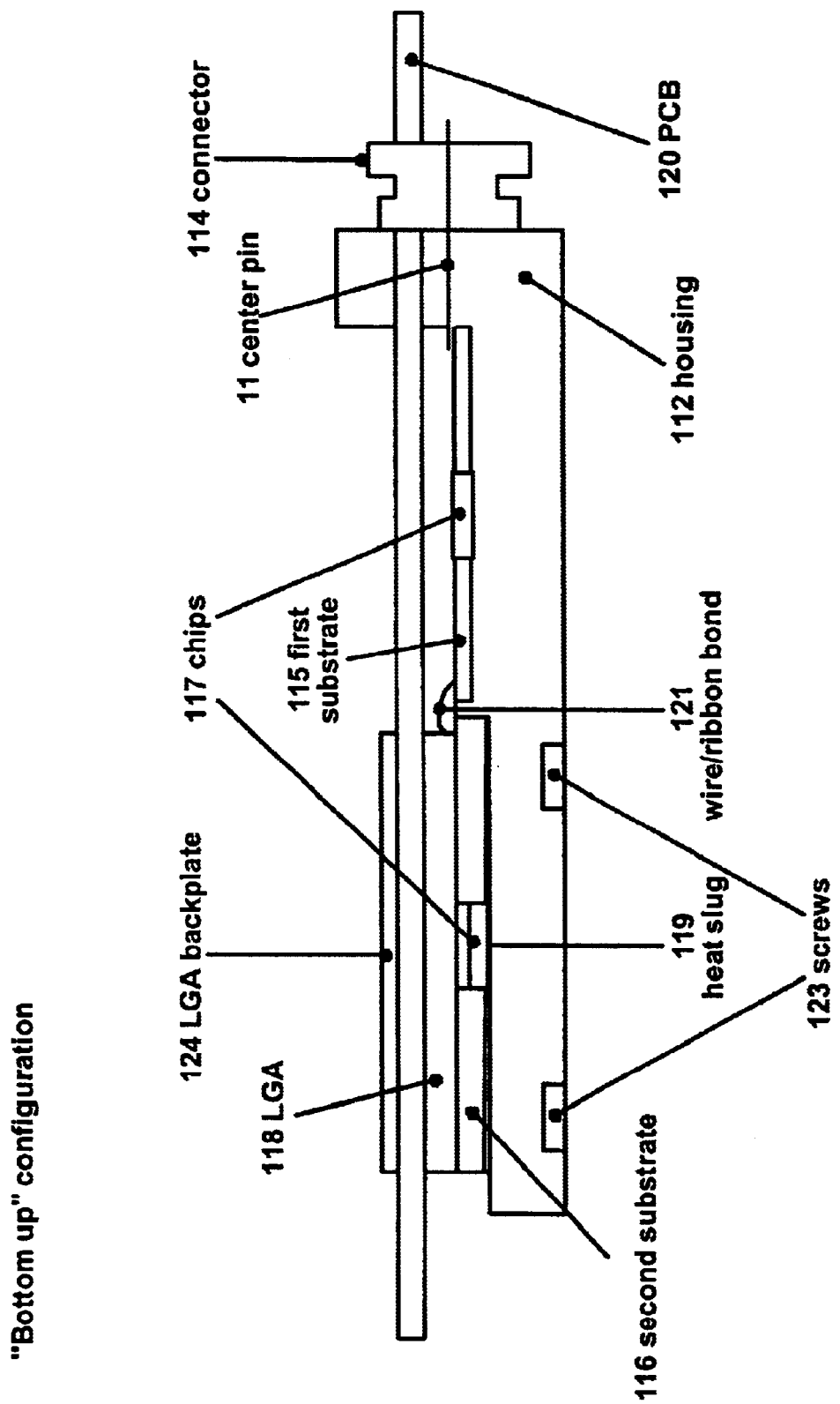
FIG. 2C provides a detailed cross-sectional view of the high-speed packaging assembly of FIG. 2A.

FIGS. 2A–2C illustrate an alternative embodiment 100 of high-speed packaging provided in accordance with the principles of this invention, high-speed package 100 is also referred herein as the "bottom-up" configuration. Accordingly, various principles and assembly process described above in connection with high-speed configuration 10 also applies to high-speed assembly configuration 100. In both embodiments, common principles of the invention remains the same, wherein the housing lip provides the alignment reference means for high-speed packaging, such as facilitating an exact signal registration between a substrate and a center pin; or providing an alignment reference means for signal registration from one substrate to another substrate on the same package; or providing an alignment reference during packaging assembly of various packaging layers. Thus, much of the principles and sequence of attendant layers described above essentially apply to this embodiment except for the relative positioning of the various packaging layers as further clarified below.

In the preferred "bottom-up" high-speed package configuration 100 of FIG. 2C, housing 112 comprises a housing base 113 of one or more adjusted height levels to accommodate one or more substrates of differing thickness. Connector 114 comprises an associated center pin 111 extending along a top surface of housing base 113. Signal registration to a bottom surface of first substrate 115 to center pin 111 results as substrate 115 is stacked atop housing base 113. This differs from the first embodiment 10 of FIGS. 1A–1C, wherein signal registration of first substrate to center pin occurs on a top surface of the first substrate as such that substrate is "floated" to a bottom surface of the housing lip in that embodiment. In the preferred embodiment of high-speed packaging 100, first substrate 114 preferably comprises thin-film since thin-film technology allows more precise thickness control over other multi-layer substrate technologies. To accommodate the height differences in one or more substrates on the same package, housing base 113 thus preferably comprises a first height under thin-film substrate 115 and a second height under a more conventional second substrate 116 to thereby accommodate the reduced thickness of thin film substrate 115 and the greater thickness of second substrate 116. Accordingly, height adjustments in housing base 113 allow a coplanar relation of the top surfaces of substrate 115 to substrate 116 to facilitate signal registration between the substrate. It is envisioned that both substrates 115 and 116 may comprise the same thickness, and in which case there is no need to have flexible height adjustment for substrates in housing base 113. As described above, it is preferred to have substrate 115 and 116 coplanar to maximize efficiency and integrity in signal registration between the two substrates. As with the first embodiment, substrate to substrate signal registration is similarly applied on the top surfaces of the two substrates. It is contemplated that this method of providing signal registration between substrate may be applied to any additional other substrate provided on the same package, and thus multiple substrates may be thereby implemented within the scope of this invention.

Thus, as described above, in embodiment 100, housing 112 comprises a housing base 113 with the subsequent intervening packaging layers stacked on top of housing base 113, rather than "floated" up as in embodiment 10 described above. Accordingly, description relating to the process of assembly of subsequent intervening packaging layers, such as LGA 118, PCB 120, and back plate 124 is similar to those described for those corresponding layers described above for FIGS. 1A–1C. Metal housing base 113 facilitates accurate placement of substrates and subsequent assembly and signal registration, as well as attendant alignment process during subsequent assembly of remaining packaging layers in package 100 that are stacked atop housing base 113. The advantage of embodiment 100 is that housing 112 can also serve as a heat sink, providing thermal dissipation as well as signal and assembly registration reference, thereby eliminating the need for a separate heat sink for chips packaged. The other major difference to this embodiment is that the electrical routing path via the LGA now propogates upward to the PCB, in the opposite direction to that of the thermal path.

It is contemplated that variable number of substrates may be assembled with the high-speed package design of this invention. The numerous lower-speed $2^{nd}$ level interconnects routed to the PCB are achieved in the format of various area array technologies. Specifically, an LGA (Land Grid Array) can be used to route numerous lower-speed I/O's up to several gigabits per second. LGA socket provides the $2^{nd}$ level interconnects between the individual component or the substrate and the PCB board. The LGA socket comprises of an interposer and spring-like contacts, which are assembled to the rest of the package through mechanical clamping. In the preferred embodiment, a back plate layer and screws are used to mechanically clamp together all intervening layers between the back plate and the substrate housing, thus eliminating the need for soldering and the attendant engineering challenges. The PCB may either "suspend" beneath the substrate sub-assembly in the "floated" substrate embodiment, or stacked over the substrate sub-assembly, as in the "bottom-up" version. The PCB, relative to the module back plate, is suspended by anchors that screw from the housing to the board. The substrate subassembly can be attached to the PCB via ways of mechanical clamping, epoxying or soldering. Such a package design partitions the regions of very high speed $2^{nd}$ level interconnects and lower speed $2^{nd}$ level interconnects so that all the high speed interconnects that require stringent mechanical tolerances reside within the substrate subassembly and the lower speed $2^{nd}$ level interconnects that do not require stringent mechanical tolerances form the interface between the subassembly and the PCB. It thus accommodates the very different requirements of high speed and lower speed interconnects and ensures the integrity and manufacturability of the final module. It is understood that the various packaging layers described herein are merely illustrative, and varying layers or number of layers underlying the substrate is possible and not intended to limit the ability of this high-speed package design to provide accurate signal to substrate, or substrate-to-substrate registration.

Accordingly, it is an essential principle of this invention to use the housing lip to provide a simple substrate alignment and signal registration mechanism between a center pin of a connector to a first substrate of the high-speed package. It is also a principle of this invention to use the housing lip as an alignment reference to ensure a coplanar relation between the top surfaces of two or more substrates where signal registration is desirable between such substrates. It is another principle of this invention to simplify and facilitate alignment and assembly of substrates and other typical packaging layers to package housing while ensuring signal integrity and addressing signal sensitivity between high-speed signal versus lower-speed signals within the assembled package.

It is contemplated that variable number of substrates may be accommodated with the high-speed package designs described in accordance with the principles of this invention. It is understood that the various packaging layers described herein are merely illustrative, and varying layers or number of layers underlying the substrate is also possible and not intended to limit the ability of this high-speed package design to provide accurate signal to substrate, or substrate-to-substrate registration. It is also preferred that the housing comprises metal and that the bonding of the housing to packaging layers and substrates is achieved with screws to avoid the more complicated bonding process that would interfere with the extreme sensitivity of high-speed circuitry provided on substrates packaged.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A high-speed electronic circuit package comprising:
   a package housing having a lip used for alignment of elements during assembly of the high-speed electronic circuit package;
   a connector attached to a bottom surface of the package housing, wherein the connector comprises a center pin abutting along a first portion of the bottom surface of the housing lip; and
   a first substrate, wherein the first substrate is aligned to abut a second portion of the bottom surface of the housing lip, wherein the second portion overlaps the first portion to place the first substrate in direct electrical registration with the center pin.

2. The high-speed electronic circuit package of claim 1 further comprising:
   a second substrate, the second substrate aligned to a third portion of the bottom surface of the housing lip, wherein a top surface of the second substrate is in a coplanar relation with a top surface of the first substrate to provide registration between the first and second substrates.

3. The high-speed electronic circuit package of claim 2 further comprising:
   one or more additional package layers, wherein a top surface of the one or more additional package layers abuts at least a bottom surface of the first substrate and the second substrate; and
   a back plate and one or more screws to bind together the housing, the first and second substrate, and the one or more additional package layers in between.

4. The high-speed package of claim 3, wherein the one or more additional package layers comprise:
   an LGA socket, wherein a top surface of the LGA socket abuts a bottom surface of the first or second substrate; and
   a PCB, wherein a top surface of the PCB abuts a bottom surface of the LGA socket, wherein the back plate and one or more screws mechanically clamp together the housing to the substrate, the LGA socket, the PCB, and the back plate.

5. The high-speed electronic circuit package of claim 2 wherein the signal registration between the first and second substrates comprises one or more electrical connections.

6. A high-speed electronic circuit package comprising:
   a package housing having a base used for alignment of elements during assembly of the high-speed electronic circuit package, a top surface of the housing lip comprising a first portion of a first height and a second portion of a second height;
   a connector attached to the top surface of the package housing, wherein the connector comprises a center pin abutting along a third portion of the top surface of the housing base; and
   a first substrate, wherein a bottom surface of the first substrate is aligned to abut the first portion of the housing base with the first portion overlapping the third portion of the housing base to place the bottom surface of the first substrate in direct electrical registration with the center pin.

7. The high-speed electronic circuit package of claim 6 further comprising:
   a second substrate, wherein a bottom surface of the second substrate is aligned to abut the second portion of the housing base having the second height such that a top surface of the first and second substrates are aligned to be coplanar to provide signal registration between the first and second substrates.

8. The high-speed electronic circuit package of claim 7 further comprising:
   one or more additional package layers, wherein a bottom surface of the one or more additional package layers abuts at least the top surface of the first or second substrate; and
   a back plate and one or more screws to bind together the housing, the first and second substrates, and the one or more additional package layers in between.

9. The high-speed package of claim 8, wherein the one or more additional package layers comprise:
   an LGA socket, wherein a bottom surface of the LGA socket abuts at least the top surface of the first or second substrate; and
   a PCB, wherein a bottom surface of the PCB abuts a top surface of the LGA socket, wherein the back plate and one or more screws mechanically clamp together the housing to the substrate, the LGA socket, the PCB, and the back plate.

10. The high-speed electronic circuit package of claim 7 wherein the signal registration between the first and second substrates comprises one or more electrical connections.

11. A high-speed electronic package assembly method comprising the steps of:
    providing a package housing having a lip used for alignment of elements during assembly of the high-speed electronic package assembly, the housing also having a signal pin wherein the signal pin comprises a signal lead abutting along a first portion of a bottom surface of the housing lip; and
    aligning a top surface of a first substrate to abut along a second portion of the bottom surface of the housing lip, wherein the second portion overlaps at least the first portion to place the first substrate in direct electrical registration with the signal lead.

12. The high-speed electronic package assembly method of claim 11 further comprising:
    aligning a top surface of a second substrate to a third portion of the bottom surface of the housing lip, wherein the top surfaces of the first and second substrates are thereby aligned and coplanar for signal registration between the first and second substrates.

13. The high-speed electronic circuit package assembly method of claim 12 further comprising:
    aligning a top surface of one or more additional package layers, wherein the top surface of the one or more additional package layers abuts at least a bottom surface of the first or second substrate; and
    binding together the housing, the first and second substrates, and the one or more additional package layers in between with an added back plate and one or more screws.

14. The high-speed electronic circuit package assembly method of claim 13 further comprising:

abutting a top surface of an LGA socket to at least the bottom surface of the first or second substrate;

abutting a top surface of a PCB to a bottom surface of the LGA socket; and mechanically clamping together the housing to the substrate, the LGA socket, the PCB, and a back plate via one or more screws.

15. The high-speed electronic circuit package assembly method of claim 12 wherein the signal registration between the first and second substrates comprises one or more electrical connections.

16. A high-speed electronic package assembly method comprising the steps of:

providing a package housing having a housing base used for alignment of elements during assembly of the high-speed electronic package assembly, the housing also comprising a connector wherein the connector comprises a center pin abutting along a first portion of a top surface of the housing base;

aligning a first substrate to abut along a second portion of the top surface of the housing base, wherein the second portion overlaps the first portion of the top surface of the housing base to place the first substrate in direct electrical registration with the center pin.

17. The high-speed electronic package assembly method of claim 16 further comprising:

aligning a top surface of a second substrate to a third portion of the bottom surface of the housing base, wherein the top surfaces of the first and second substrates are thereby aligned and coplanar to provide signal registration between the first and second substrates.

18. The high-speed electronic package assembly method of claim 16 wherein the first substrate comprises thin-film.

19. The high-speed electronic circuit package assembly method of claim 17 further comprising:

aligning a top surface of one or more additional package layers, wherein a bottom surface of the one or more additional package layers abuts at least the top surface of the first substrate and the second substrate; and binding together the housing, the first and second substrates, and the one or more additional package layers in between with an added back plate and one or more screws.

20. The high-speed electronic circuit package assembly method of claim 17 further comprising:

abutting a bottom surface of an LGA socket to the top surface of the first or second substrate; and abutting a top surface of a PCB to a bottom surface of the LGA socket, wherein the back plate and one or more screws mechanically clamp together the housing to the first or second substrate, the LGA socket, the PCB, and the back plate.

21. The high-speed electronic circuit package assembly method of claim 17 wherein the signal registration between the first and second substrates comprises one or more electrical connections.

* * * * *